United States Patent
Manos et al.

(10) Patent No.: US 10,189,700 B2
(45) Date of Patent: Jan. 29, 2019

(54) INTEGRATED CIRCUIT (IC) CHIP WITH A SELF-CONTAINED FLUID SENSOR AND METHOD OF MAKING THE CHIP

(71) Applicant: U.S.A. as represented by the Administrator of the National Aeronautics and Space Administration, Washington, DC (US)

(72) Inventors: George Manos, Laurel, MD (US); Manuel A. Balvin, Springfield, VA (US); Michael P. Callahan, Boise, ID (US)

(73) Assignee: The United States of America as represented by the Administrator of NASA, Washington, DC (US)

( * ) Notice: Subject to any disclaimer, the term of this patent is extended or adjusted under 35 U.S.C. 154(b) by 50 days.

(21) Appl. No.: 15/278,359

(22) Filed: Sep. 28, 2016

(65) Prior Publication Data
US 2018/0086629 A1 Mar. 29, 2018

(51) Int. Cl.
*G01F 1/708* (2006.01)
*G01K 7/01* (2006.01)
*B81B 7/00* (2006.01)
*B81C 1/00* (2006.01)
*G01F 1/684* (2006.01)

(52) U.S. Cl.
CPC ........ *B81B 7/0061* (2013.01); *B81C 1/00309* (2013.01); *G01F 1/7084* (2013.01); *G01K 7/01* (2013.01); *B81B 2201/0278* (2013.01); *G01F 1/6845* (2013.01)

(58) Field of Classification Search
CPC ........ B81B 7/00; B81B 7/006; B81B 7/0061; B81C 1/00; B81C 1/003; B81C 1/003; B81C 1/00309; G01F 1/70; G01F 1/78; G01F 1/7084
USPC .......................................... 257/467
See application file for complete search history.

(56) References Cited

U.S. PATENT DOCUMENTS

| 7,181,963 B2 * | 2/2007 | Bork ........................ G01F 1/68 73/204.26 |
| 7,259,080 B2 * | 8/2007 | Quenzer et al. ........ H01L 21/46 438/455 |

* cited by examiner

*Primary Examiner* — Monica D Harrison
(74) *Attorney, Agent, or Firm* — Christopher O. Edwards; Bryan A. Geurts; Mark P. Dvorscak

(57) ABSTRACT

An integrated circuit (IC) chip with a self-contained fluid sensor and method of making the chip. The sensor is in a conduit formed between a semiconductor substrate and a non-conductive cap with fluid entry and exit points through the cap. The conduit may be entirely in the cap, in the substrate or in both. The conduit includes encased temperature sensors at both ends and a central encased heater. The temperature sensors may each include multiple encased diodes and the heater may include multiple encased resistors.

5 Claims, 5 Drawing Sheets

INTEGRATED CIRCUIT (IC) CHIP WITH A SELF-CONTAINED FLUID SENSOR AND METHOD OF MAKING THE CHIP

ORIGIN OF THE INVENTION

The invention described herein was made by an employee of the United States Government, and may be manufactured and used by or for the Government for governmental purposes without the payment of any royalties thereon or therefor.

BACKGROUND OF THE INVENTION

Field of the Invention

The present invention is generally related to instruments for measuring fluid temperature and flow rate and more particularly to sensors for space-bourne applications for measuring fluid temperature and flow rate.

Background Description

National Aeronautics and Space Administration (NASA) scientists are developing next generation microfluidic instruments, e.g., lab-on-a-chip, for space based applications and on planetary bodies. Producing a lab-on-a-chip requires advancements in miniaturization, especially for analytical systems, requires an on-chip, in situ fluid flow and fluid temperature measurement capability. Unfortunately, state of the art sensors are either too large for integration on-chip, requiring diverting fluid off-chip for measurement by a flow sensor and a temperature sensor. Only after the measurement is complete is the fluid returned to the chip. These sensors are still incapable of measuring flow rates, while requiring increased fluid volume (and corresponding weight) at a higher risk of on-board system fluid leaks.

Thus, there is a need for an on-chip flow and temperature sensor for measuring microfluidic flow rates and temperatures, and more particularly, for accurately measuring microfluidic flow rates and temperatures for next generation microfluidic space-bourne instruments traveling to extraterrestrial planetary bodies.

SUMMARY OF THE INVENTION

An aspect of the invention is a self-contained fluid flow rate and temperature sensor;

Another aspect of the invention is an on-chip capability for measuring nano-liter per minute fluid flow rates over a broad temperature range;

It is yet another aspect of the invention an on-chip, self-contained fluid flow rate and temperature sensor for measuring fluid flow at rates in the nano-liter per minute range and over temperatures ranging from below −80° C. to above 150° C. in any application that requires accurate temperature and flow measurements.

The present invention relates to an integrated circuit (IC) chip with a self-contained fluid sensor and method of making the chip. The sensor is in a conduit formed between a semiconductor substrate and a non-conductive cap with fluid entry and exit points through the cap. The conduit may be entirely in the cap, in the substrate or in both. The conduit includes encased temperature sensors at both ends and a central encased heater. The temperature sensors may each include multiple encased diodes and the heater may include multiple encased resistors.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1A:
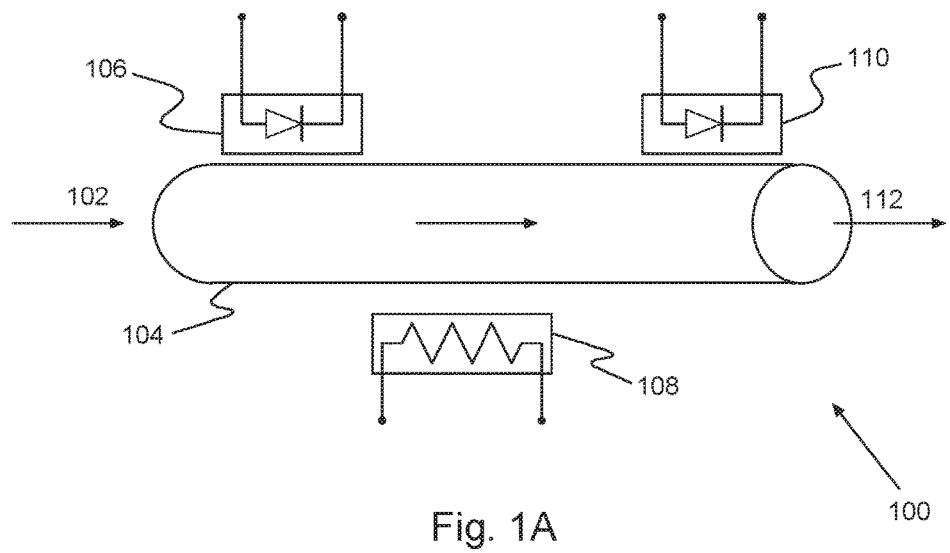
FIGS. 1A-B show a schematic and plan view example of a Dynamic On-Chip Flow and Temperature Sensor (DOC-FlaTS) for sensing on-chip fluid flow and temperature, according to a preferred embodiment of the present invention.
Figure 1B:
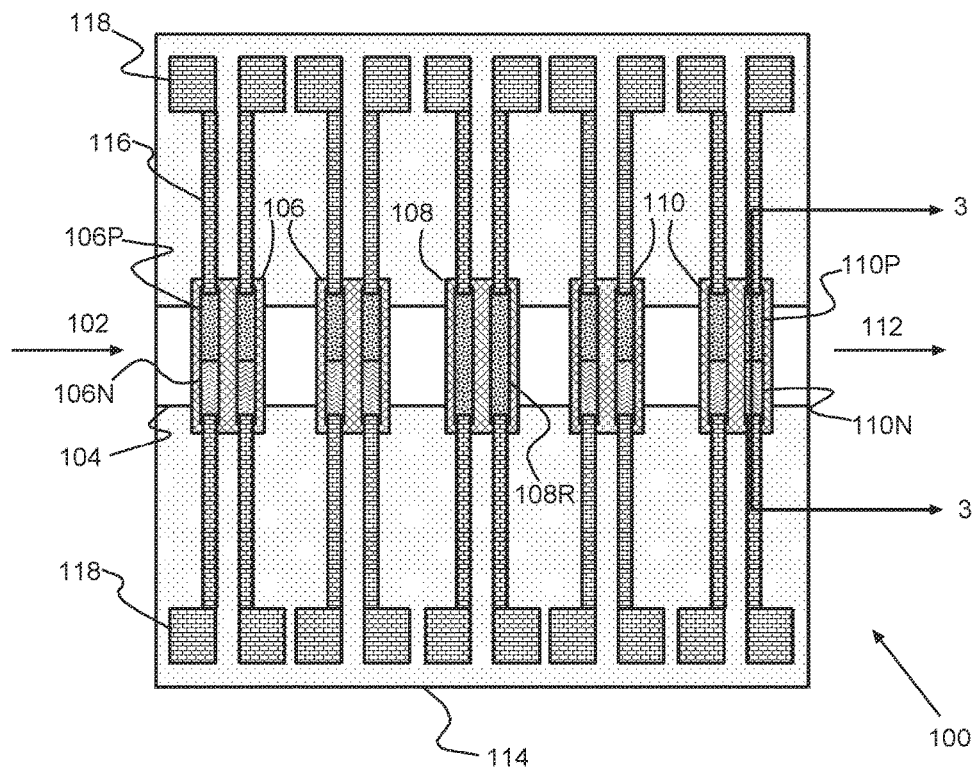

Turning now to the drawings, and more particularly, FIGS. 1A-B show a schematic and plan view example of a Dynamic On-Chip Flow and Temperature Sensor (DOC-FlaTS) 100 for sensing on-chip fluid flow and temperature, according to a preferred embodiment of the present invention. Preferred sensors 100 provide on-board, on-chip capability for measuring flow rates in the nano-liter per minute (nl/min) range, at temperatures from below −80° C. to above 150° C. in any application that requires accurate temperature and flow measurements.

Fluid enters 102 at one end of an embedded conduit 104 where one or more front-end or input temperature sensors 106 measure fluid temperature. One or more heating elements 108 selectively heat the fluid before it passes by one or more back-end or output temperature sensors 110 to exit 112 the conduit 104. Preferably, the channel 102 is formed partially in, or on, a capped semiconductor, e.g., silicon (Si), wafer 114. Preferably also, temperature sensors 106, 110 and heater 108 are encased in Silicon Nitride (SiN) for electrical isolation, and are connected through wires 116 externally at pads 118. For maximum fluid surface contact, preferably, the temperature sensors 106, 110 are suspended in the conduit 104 to optimize sensitivity and response time.

In this example the input temperature sensors 106 and output temperature sensors 110 each include two pair, or 4, polysilicon diodes, i.e., PN junctions 106P, 106N and 110P, 10N. Also in this example, the heaters 108 are a pair of polysilicon resistors (R) 108R with resistor current ($I_R$) selectively applied to dissipate power ($I_R^2 R$) generating localized heat in the conduit 104. The polysilicon diodes 106P, 106N and 110P, 110N exhibit determinable sensitivity to junction temperature (T). Diode 106P, 106N and 110P, 110N junction thermal voltage ($V_T$) is a constant at any absolute temperature, defined by $V_T = kTq$, where k is the Boltzmann constant, q is the magnitude of charge of an electron, and the rate of change is ~2.2 milliVolts (~2.2 mV) per degree Kelvin (° K.).

Fluid entering 102 the conduit 104 at input temperature sensors 106 exhibits a temperature difference (dT) with the fluid exiting 112 at output temperature sensors 110, that may also be measured among individual sensor junctions 106P, 106N and 110P, 110N. That temperature difference is dependent upon the length of time passing heaters 108 and between sensors 106, 110, and, therefore, is a measure of fluid flow or velocity through the conduit 104. During operation, temperature sensors 106, for example, 110 may be biased at a fixed current ($I_D$) or fixed voltage ($V_D$) and absolute temperature (T) for each diode may be derived from the well-known, ideal diode relationship, $$I_D = I_S\left(e^{\frac{V_D}{nV_T}} - 1\right),$$

where n is a diode quality factor.

Thus, the front-end temperature sensors 106 allow for one or more initial fluid temperature readings before passing the heater 108. Fluid thermal conductance, fluid heat capacity combine with heat from power to the heaters 108 to elevate temperature of the fluid traversing the conduit 104. The back-end temperature sensors 110 allow for measuring heat injected into the conduit 104 fluid from dT. For example, the temperature difference reflected in diode voltage change ($dV_D$) between sensor junctions 106P, 106N and 110P, 110N provides a measure of microfluidic flow rate through the conduit 104 according to the relationship, $dV_D/dT = V_D/T - E_g/T - 2Kq$, where $E_g$ is the substrate energy band gap. Accordingly, a self-contained preferred sensor 100 provides a single chip solution for accurately measuring microfluidic, on-chip flow rates and temperatures, especially for next generation microfluidic space-bourne instruments.

Figure 2:
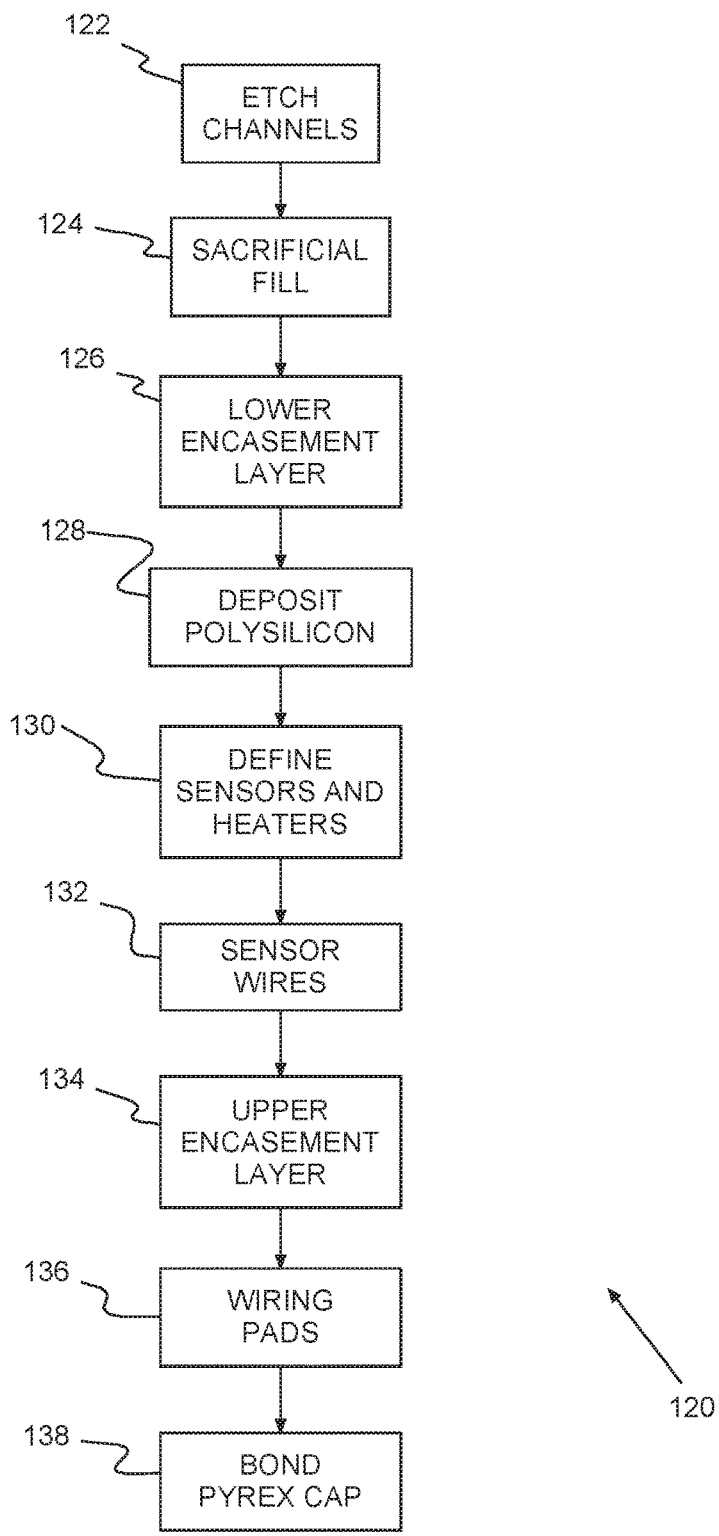
FIG. 2 shows a flow diagram for fabricating the sensors on a semiconductor wafer.
Figure 3A:
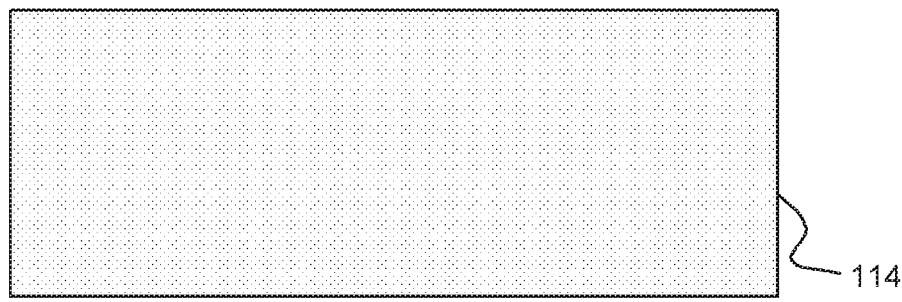
FIGS. 3A-G show a cross-sectional example of forming an IC chip with a preferred flow and temperature sensor.
Figure 3B:
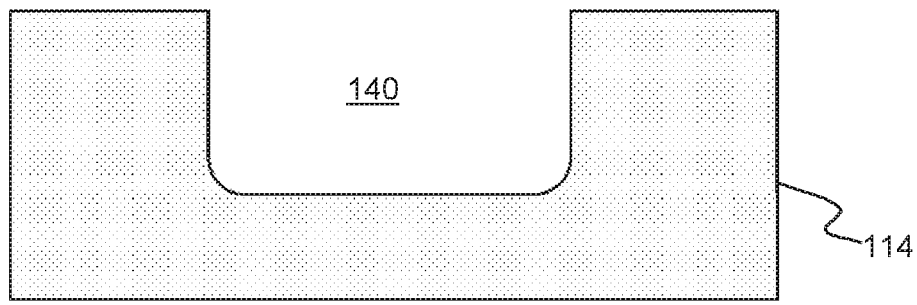
Figure 3C:
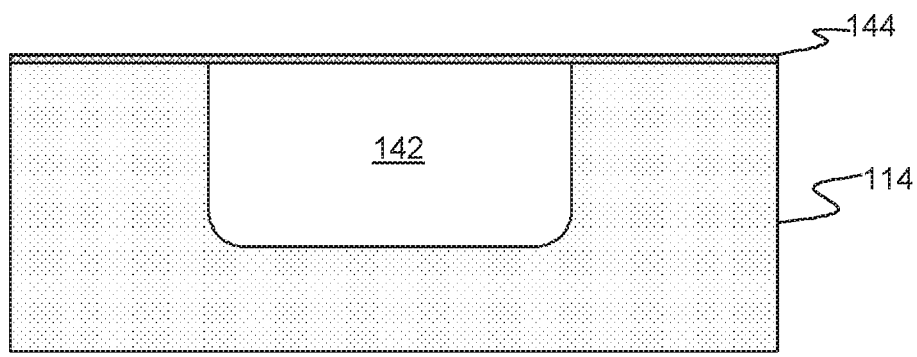
Figure 3D:
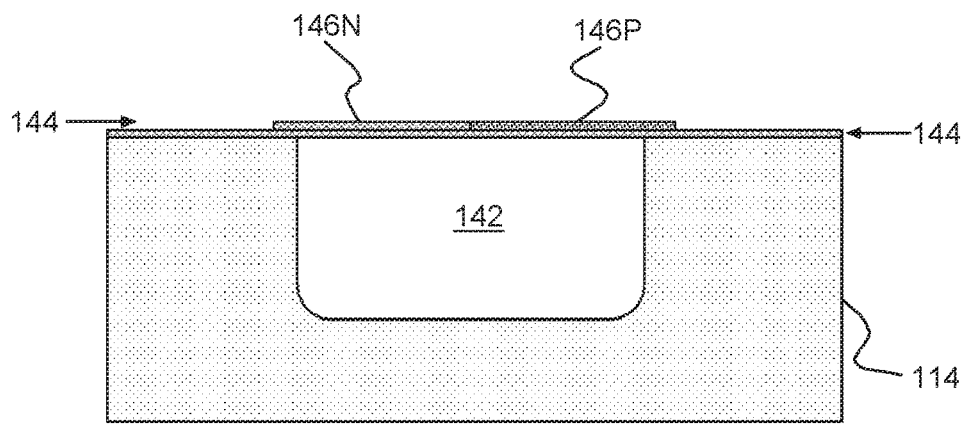
Figure 3E:
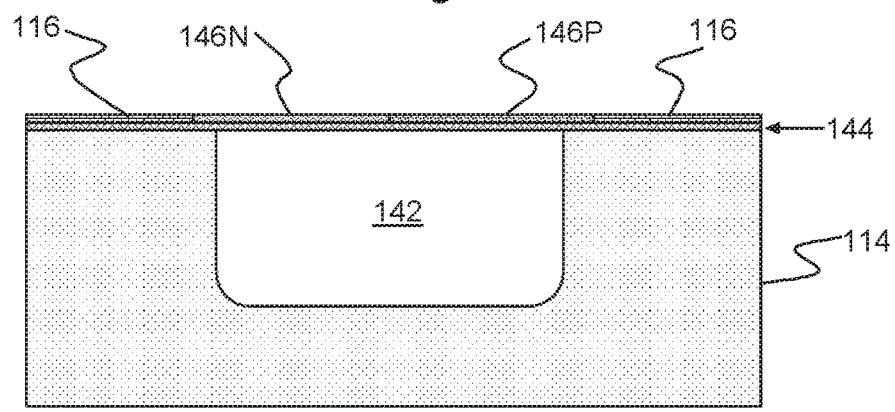
Figure 3F:
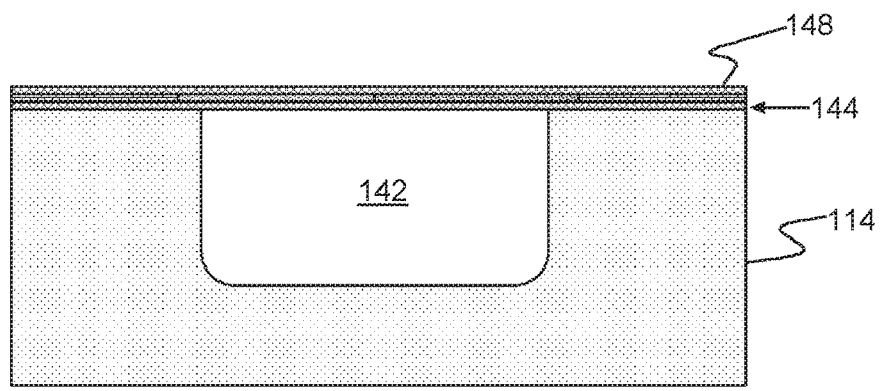
Figure 3G:
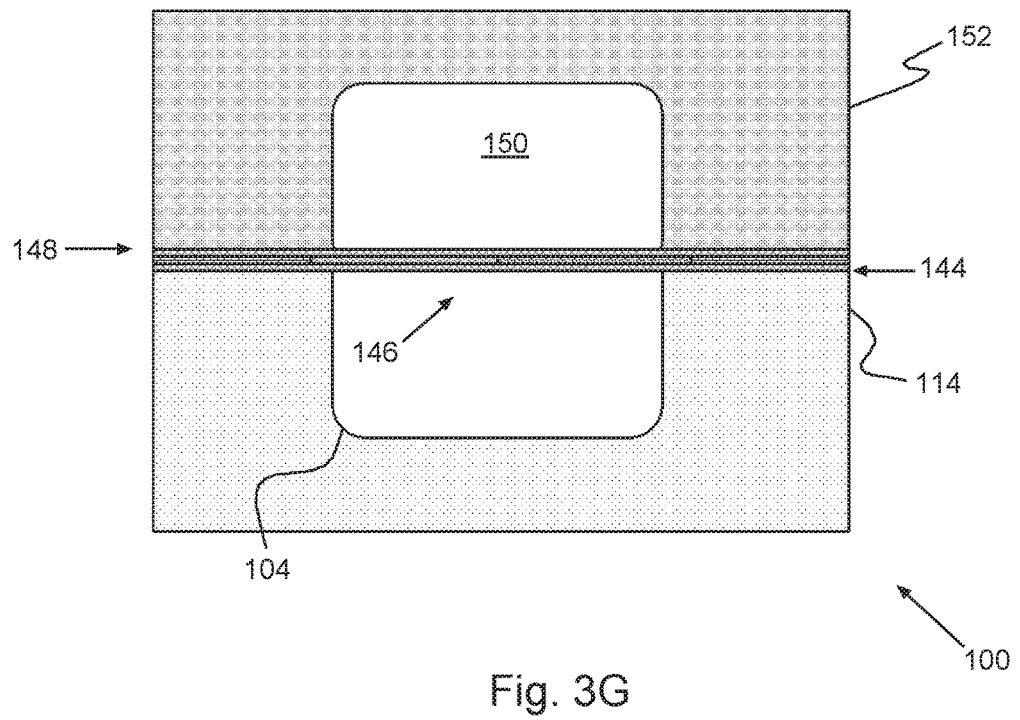

FIG. 2 shows a flow diagram 120 example of fabricating the preferred sensors (100 in FIGS. 1A-B) on a semiconductor substrate wafer 114. First in this example, micro-channels 104 are etched 122 into the wafer. A sacrificial layer is deposited 124 on to the wafer to back fill the substrate channels 104 and re-planarize to the wafer surface. A lower encasement layer is formed 126 on the wafer, e.g., using low pressure chemical vapor deposition (LPCVD). Polysilicon, doped or undoped, is deposited 128 on the lower encasement layer, patterned and selectively doped, to define 130 the temperature sensors 106, 110, e.g., diodes, and resistive heater(s) 108. Connective wiring is formed 132 to each of the temperature sensor 106, 110 diodes and the resistive heater(s) 108. Forming 134 an upper encasement layer on the patterned polysilicon, encases and encloses all temperature sensors 106, 110 and heaters 108. Pads for probing or connecting to other sensing circuits are formed 136, e.g., at the edge of the sensor 100, wafer 114 or each chip, and wafer and/or chip fabrication may complete. A corresponding micro-channel in a non-conductive cap, e.g., pyrex, bonded 138 to the wafer 114 forms/completes the conduit 104.

FIGS. 3A-G show a cross-sectional example of forming an IC chip with a preferred flow and temperature sensor 100 through 3-3 in FIG. 1B, formed as described in FIG. 2 and with like features labeled identically. Although the channel 140 *jn* silicon wafer 114 shown in this example has a rectangular cross-section with rounded corners, this is for example only. The channel 140 may have any shape as desired formed in the substrate 114, e.g., completely rounded or cylindrical, oval or square, as selected by design and constrained by fabrication.

Typically, a preferred sensor 100 occupies a small portion of the overall integrated circuit (IC) chip. For a 10 mm×15 mm chip, for example, the flow and temperature sensor 100 may be 0.08 mm×0.8 mm within a 10.0 mm long by 0.08 mm wide channel 140 etched 122 in the semiconductor wafer 114. A Low Thermal Oxide (LTO) may be deposited 124 to form sacrificial material, back filling the channels 140, e.g., using LPCVD. Then, sacrificial material is removed from the wafer, e.g., using a typical chemical-mechanical (chem-mech) polish, to re-planarize the wafer surface, with the back fill LPCVD LTO 142 remaining in the channel(s) 104 and providing a flat surface for subsequent fabrication.

Having filled and re-planarized, LPCVD SiN layer forms 126 the lower encasement layer 144. The lower encasement layer 144 is 100-200 nanometers thick (100-200 nm), preferably, 150 nm thick. The lower encasement layer 144 is patterned, e.g., using a typical photolithographic pattern (mask) and etching, to define sensor 106, 110 locations and heater 108 locations. The patterned lower encasement layer 144 positions the temperature sensor 106, 110 diodes and resistive heaters 108 in the conduit 104, e.g., centrally located, for maximum fluid surface contact in the conduit 104.

Eighty micron (80 μm) long polysilicon strips, preferably, 0.2 μm thick and 0.5-1.0 μm wide, are formed using a LPCVD and mask and etch. The polysilicon strips locate the temperature sensor 106, 110 diodes and heater resistors 108R. For example, a 0.2 μm thick polysilicon layer may be deposited as doped polysilicon, e.g., P-doped, undoped, or intrinsic polysilicon. Patterning the polysilicon defines the strips, and doping the strips defines diodes and heaters. For undoped polysilicon, for example, the strips may be implanted with P-type dopant, preferably, boron. Masking the P-doped polysilicon to protect the resistors 108R and portions of the diode strips 146P, exposed portions 146N of the strips are implanted with N-type dopant, preferably, phosphorus, forming polysilicon diodes 146.

After forming 132 connective wires 116 to each of the temperature sensor 106, 110 diodes and the resistive heater(s) 108, an upper encasement layer 148 is deposited. Preferably, the upper encasement layer 148 is SiN, 50-150 nm, and preferably, 150 nm thick. Then, the upper encasement layer 148 is patterned 134, encasing and enclosing all polysilicon temperature sensors 106, 110 and heaters 108 in a silicon nitride membrane strong enough to withstand the laminar flow within the conduit 104. Other IC circuits, e.g., sensing and support circuits, may be formed tailored by design to the preferred sensors 100. Bond pads may be formed 136, for example, by depositing and patterning a suitable metal with the bond pads 118 remaining exposed. The bond pads 118 provide, for example, for connection to another chip, for wafer level test probing, or for connection to other sensing circuits, e.g., at the edge of the sensor.

In this example IC fabrication completes 138 connecting circuits together, to bond pads 118 and off chip, and the remaining LPCVD LTO 140' is removed suspending the temperature sensors 106, 110 and heaters 108 in the middle of the conduit 104. In operation the suspended temperature sensors 106, 110 are completely immersed in the fluid in the conduit 104, thermally isolating them from ambient for faster flow and temperature change responses.

After completing ICs 138, bonding a corresponding channel 150 in a pyrex cap 152 to the wafer 114 completes the conduit 104. The bonded pyrex cap 152 houses the flow and temperature sensors in the completed conduit 104. The pyrex cap 152 also houses a tapered inlet via 102 and outlet via 112 clamped to the wafer 114 witr nano-ferrules and capillary tubes (not shown) to produce a leak-tight channel to macro-scale connection.

Figure 4:
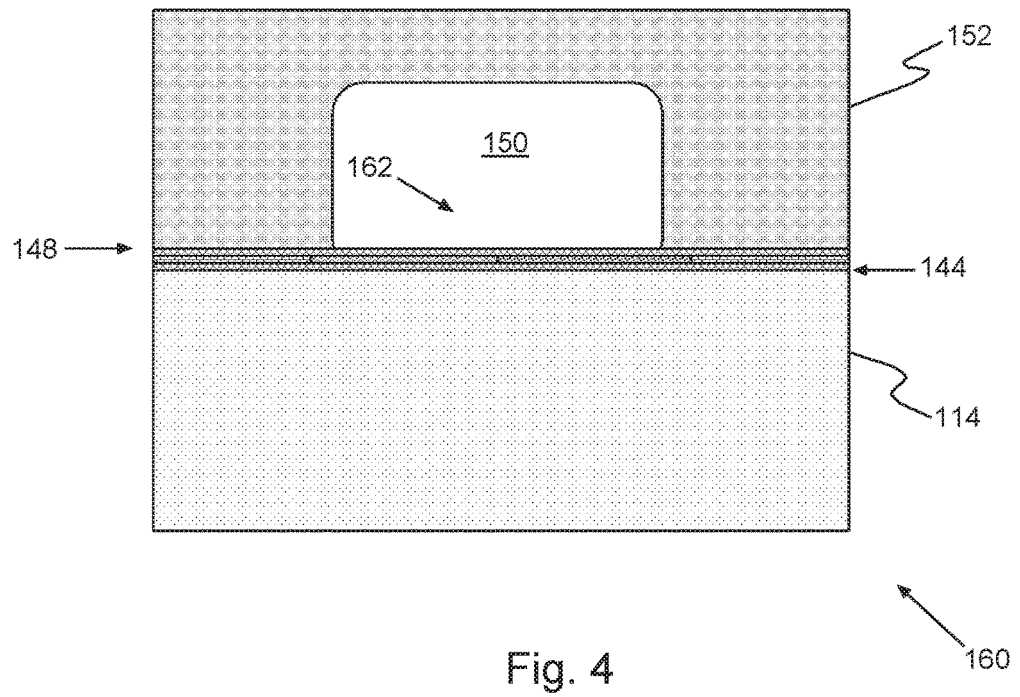
FIG. 4 shows an alternate embodiment cross-sectional example of forming an IC chip with a preferred flow and temperature sensor.

FIG. 4 shows an alternate embodiment cross-sectional example of forming an IC chip with a preferred flow and temperature sensor 160, also formed as described in FIG. 2 and with like features labeled identically. In this alternate example channels are not formed in the wafer 114. Instead, the lower encasement layer 144 is formed on the semiconductor wafer 114, placing the sensors 162 and heaters at the bottom of the conduit 104'. The upper encasement layer 148 encases and encloses all polysilicon sensor diodes 162 and heaters. Also in this example, the channel 150 in the pyrex cap 152 bonded to the wafer 114 forms the entire sensor conduit 104. While this embodiment is less thermally isolated, on the bottom on the conduit 104, the temperature sensors 106, 110 and heaters 108 are more mechanically robust and simpler to fabricate.

Advantageously, preferred on-chip flow and temperature sensors eliminate the need to route fluid off-chip and out of an analytical system for separately measuring flow rate and temperature. Preferred sensors are capable of accurately measuring flow rates down to the nano-liter per minute range. Temperature measurement capabilities range from below −80° C. to above 150° C. Further, preferred sensors provide for analyzing relatively small, even minute, individual system samples, thereby reducing the total required fluid mass and volume. This reduction is a key requirement for space-bourne microfluidic instruments used on both space and planetary platforms. Thus, preferred sensors provide an on-board, on-chip application capability wherever accurate temperature and flow measurements may be required.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. An integrated circuit (IC) chip including a self-contained fluid sensor comprising:
    a semiconductor substrate;
    a non-conductive cap disposed on said semiconductor substrate;
    a conduit at the interface between said semiconductor substrate and said nonconductive cap, each end of said conduit passing through said non-conductive cap;
    a temperature sensor in said conduit at said each end; and
    a heating element in said conduit between the temperature sensors wherein the temperature sensors and said heating element are encased in dielectric; further wherein said non-conductive cap is a pyrex cap with a channel at said semiconductor substrate, wherein said conduit comprises said channel and
    wherein said semiconductor substrate comprises a mirco-channel, said conduit further comprises said mirco-channel, the encased temperature sensors and said heating element being suspended in said conduit at said interface.

2. An IC chip as in claim 1, wherein the encased temperature sensors and the encased heating element are disposed on said semiconductor substrate at said interface.

3. An IC chip as in claim 1, wherein said semiconductor substrate is silicon and each said temperature sensor comprises one or more polysilicon diodes and said heating element comprises one or more polysilicon resistor.

4. An IC chip as in claim 3, wherein said one or more polysilicon diodes comprises two pair of diodes and said polysilicon resistor comprises a pair of resistors.

5. An IC chip as in claim 4, further including one or more circuits on said silicon substrate and connected to said two pair of diodes and said pair of resistors.

* * * * *